United States Patent [19]
Hayashi et al.

[11] Patent Number: 5,258,206
[45] Date of Patent: Nov. 2, 1993

[54] METHOD AND APPARATUS FOR PRODUCING DIAMOND THIN FILMS

[75] Inventors: Nariyuki Hayashi; Toshimichi Ito, both of Sodegaura, Japan

[73] Assignee: Idemitsu Petrochemical Co., Ltd., Tokyo, Japan

[21] Appl. No.: 813,041

[22] Filed: Dec. 23, 1991

Related U.S. Application Data

[63] Continuation of Ser. No. 460,799, Jan. 4, 1990, abandoned.

[30] Foreign Application Priority Data

Jan. 13, 1989 [JP] Japan .................................. 1-6292
Jan. 13, 1989 [JP] Japan .................................. 1-6293

[51] Int. Cl.$^5$ .............................. B05D 3/06; B01J 3/06
[52] U.S. Cl. .................................. 427/577; 427/569; 423/446
[58] Field of Search ............... 427/39, 38, 40, 41, 427/577, 569; 423/446, 447.2, 459

[56] References Cited

U.S. PATENT DOCUMENTS

| | | | |
|---|---|---|---|
| 4,767,608 | 8/1988 | Matsumoto et al. | 427/39 |
| 4,816,286 | 3/1989 | Hirose | 427/39 |
| 4,859,490 | 8/1989 | Ikegaya et al. | 427/38 |
| 4,869,923 | 9/1989 | Yamazaki | 427/38 |
| 4,935,303 | 6/1990 | Ikoma et al. | 427/38 |
| 4,938,940 | 7/1990 | Hirose et al. | 423/446 |
| 4,946,568 | 8/1990 | Kalwar et al. | 427/39 |
| 4,989,543 | 2/1991 | Schmitt | 427/39 |
| 5,007,373 | 4/1991 | Legg et al. | 427/39 |

FOREIGN PATENT DOCUMENTS

| | | |
|---|---|---|
| 0092435 | 10/1983 | European Pat. Off. |
| 0288065 | 10/1988 | European Pat. Off. |
| 60-122794 | 7/1985 | Japan . |
| 62-67174 | 3/1987 | Japan . |
| 62-265198 | 11/1987 | Japan . |
| 63-117991 | 5/1988 | Japan . |
| 63-117992 | 5/1988 | Japan . |
| 63-117994 | 5/1988 | Japan . |
| 63-117995 | 5/1988 | Japan . |
| 63-166733 | 7/1988 | Japan . |
| 63-225556 | 9/1988 | Japan . |
| 63-285192 | 11/1988 | Japan . |

OTHER PUBLICATIONS

"Diamond Thin Films", Chem. & Eng. News, May 15, 1989, pp. 32-33.
Singh et al. Applied Physics Letters, vol. 52, No. 6, pp. 451-452, Feb. 8, 1988.
Pellicori et al. Journal of Vacuum Science & Technology/Part A, vol. 4, No. 5, 2nd series, pp. 2350-2355, Sep.-Oct. 1986.
Journal of Crystal Growth, vol. 93, Nos. 1-4, pp. 228-234, Nov.-Dec. 1988 Wang et al.

Primary Examiner—Marianne Padgett
Attorney, Agent, or Firm—Nikaido, Marmelstein, Murray & Oram

[57] ABSTRACT

The present invention concerns a method of producing a diamond thin film. A plasma-activated gas, obtained by exciting a starting material containing a carbon source gas, is brought into contact with a surface of a substrate, on which a diamond thin film is to be formed under the presence of an auxiliary member placed adjacent to a protruded portion present at the surface of the substrate. The diamond thin film is thereby formed on the substrate. An apparatus for producing a diamond thin film by means of a microwave plasma method has an auxiliary member placed adjacent to a protruded portion present at the surface of the substrate on which the diamond thin film is to be formed.

6 Claims, 4 Drawing Sheets

METHOD AND APPARATUS FOR PRODUCING DIAMOND THIN FILMS

This application is a continuation of application Ser. No. 460,799 filed Jan. 4, 1990 and now abandoned.

BACKGROUND OF THE INVENTION (1) Field of the Invention

The present invention relates to a method of and an apparatus for producing diamond thin films. More particularly the present invention relates to a method of producing diamond thin films having uniform film thickness and excellent adhesion, as well as an apparatus for producing diamond thin film.

(2) Description of the Related Art

Since diamond films or diamond-like carbon films (i-carbon etc.) are excellent in hardness, abrasion resistance, electric insulation, heat conductivity and solid lubricancy, they have been utilized, for example, as hard coating material for various members such as cutting tools, abrasion-resistant machinery parts, as well as electronic material.

As a method of producing diamond thin films, a vapor phase method has generally been used.

A method of manufacturing diamond films has been disclosed in, for example, Japanese Patent Application Laid-Open 63-166733, which comprises placing a substrate on which metal or metal compound is uniformly scattered in a reaction vessel, heating the vessel to 500°-1300° C., then introducing a gas, for forming a diamond film at least containing hydrogen atoms, carbon atoms and oxygen atoms into the reaction vessel and activating the gas to thereby deposit the diamond film on the surface of the substrate.

In this method, however, since the substrate on which diamond films are to be formed is placed on a flat support table, when the diamond forming gas is activated, for example, by means of microwaves or high frequency waves, plasmas are locally concentrated on the edges of the substrate protruding on the support table, for example, ridge lines, especially corners of the substrate.

If a cutting tool coated with diamond thin films is produced by using the above-mentioned method, plasmas are locally concentrated on the edges of the cutting tool. Since the thickness of the film is abnormally increased in these portions which makes the film thickness not uniform abrupt changes of thermal stresses or inner stresses are caused. Therefore, it is only possible to obtain a cutting tool coated with a diamond thin film of poor durability in which the diamond thin film is liable to be exfoliated at the cutting portion which is most important to the cutting tool.

Japanese Patent Application Laid-Open 63-285192 also discloses a method of synthesizing a diamond film by means of a vapor phase process using a carbon source compound and a hydrogen source compound, in which the carbon source compound and the hydrogen source compound are partially or entirely preheated before excitation.

However, in this method, since the substrate on which the diamond film is to be formed is also placed on a flat support table, when the carbon source compound and the hydrogen source compound are excited, for example, by means of microwaves or high frequency waves, the foregoing problem of local concentration of plasmas is also present.

That is, a conventional method of producing a diamond film using the vapor phase method, particularly, by means of a method involves a problem that the plasmas are locally concentrated on the edges and, most of all, it is difficult to produce a diamond film of excellent uniform film thickness causing less exfoliation by means of a microwave plasma method or a high frequency wave plasma method causing plasma heat evolution of the substrate by plasma.

SUMMARY OF THE INVENTION

The present invention has been accomplished in view of the foregoing situations.

The object of the present invention is to provide a method capable of forming a diamond thin film having uniform film thickness and excellent adhesion, as well as to provide an apparatus for producing a diamond thin film capable of easily forming such an excellent diamond thin film.

The present invention for attaining the foregoing object concerns a method of producing a diamond thin film. As gas, obtained by exciting a starting material gas, containing a carbon source gas is brought into contact with a surface of a substrate on which a diamond thin film is to be formed under the presence of an auxiliary member placed adjacent to a protruded portion present at the surface of the substrate on which the diamond thin film is to be formed. An apparatus for producing a diamond thin film by means of a microwave plasma method, comprises an auxiliary member placed adjacent to a protruded portion present on the surface of the substrate on which a diamond thin film is to be formed.

DESCRIPTION OF THE PREFERRED EMBODIMENTS

Figure 1:
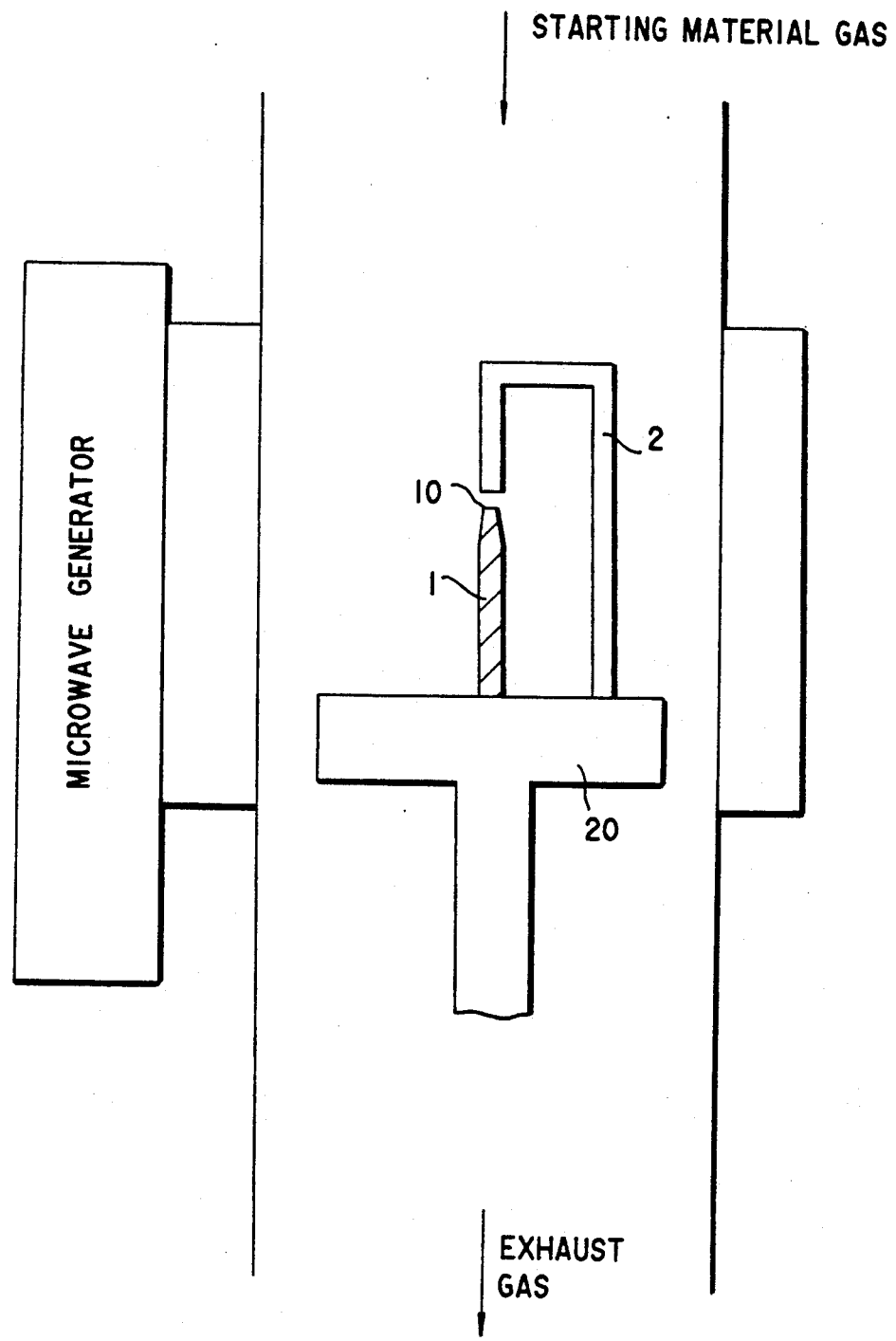
FIG. 1 is an explanatory view illustrating an example for the relationship between a substrate on which the thin film is to be formed and an auxiliary member in the case of using a microwave plasma CVD apparatus in the producing method according to the present invention.

In the method according to the present invention, a starting material gas containing a carbon source gas is introduced into a reaction chamber.

As the starting material gas serving for the present invention, any of gases containing at least a carbon source gas may be used and gases containing at least carbon atoms and hydrogen atoms are preferred, gases containing carbon atoms, hydrogen atoms and oxygen atoms being particularly preferred.

Specifically, as the starting material gas, there can be mentioned, for example, a gas mixture of a carbon source gas and a hydrogen gas, and an oxygen-containing hydrocarbon compound gas.

A carrier gas such as an inert gas may also be used, if desired together with the starting material gas.

As the carbon source gas, gases of various hydrocarbons, oxygen-containing compounds, nitrogen-containing compounds, halogen-containing compound etc. may be used.

As the hydrocarbon compound, there can be mentioned, for example, paraffinic hydrocarbons such as methane, ethane, propane and butane; olefinic hydrocarbons such as ethylene, propylene and butylene; acetylene hydrocarbons such as acetylene or allylene; diolefin hydrocarbons such as butadiene; cycloaliphatic hydrocarbons such as cyclopropane, cyclobutane, cyclopentane or cyclohexane; aromatic hydrocarbon such as benzene, toluene, xylene, naphthalene, etc.

As the oxygen-containing compound, there can be mentioned, for example, alcohols such as methanol, ethanol, propanol and butanol; ethers such as methyl ether, ethyl ether, ethyl methyl ether, methyl propyl ether, ethyl propyl ether, phenol ether, acetal and cyclic ethers (dioxane, ethylene oxide, etc.); ketones such as acetone, diethyl ketone, pinacolin, methyl oxide, aromatic ketone (acetophenone, benzophenone etc), diketone and cyclic ketone; aldehydes such as formaldehyde, acetoaldehyde, butylaldehyde and benzaldehyde; organic acids such as formic acid, acetic acid, propionic acid, succinic acid, lactic acid, oxalic acid, tartaric acid and stearic acid; acid esters such as methyl acetate and ethyl acetate; dihydric alcohols such as ethylene glycol and diethylene glycol; carbon monoxide, carbon dioxide, etc.

As the nitrogen-containing compound, there can be mentioned, for example, amines such as trimethylamine and triethylamine.

As the halogen-containing compound, then can be mentioned, for example, methyl chloride, methyl bromide, methyl chloride, dichloromethane, chloroform, etc.

Among the carbon source gases, preferred are those oxygen-containing compounds which are gaseous or having high vapor pressure at normal temperature, for example, paraffinic hydrocarbons such as methane, ethane and propane; ketones such as acetone and benzophenone, alcohols such as methanol and ethanol, carbon monoxide and carbon dioxide gas.

There is no particular restriction for the hydrogen gas and it is possible to use those gases prepared by gasification of petroleums, denaturation of natural gas or water gas, electrolysis of water, reaction of iron and steams and complete gasification of coal, after sufficient purification.

Hydrogen of the hydrogen gas forms atomic hydrogen upon excitation.

The atomic hydrogen has an effect of removing a component (amorphous carbon or graphite, etc.) deposited simultaneously with the deposition.

The total flow rate of the starting material gas is usually from 1 to 1000 SCCM and, preferably, from 10 to 200 SCCM.

The mixing ratio of the carbon source gas and the hydrogen gas when using a gas mixture of the hydrocarbon source and the hydrogen gas as the starting material gas is as follows: the carbon source gas flow rate is usually, from 0.1 to 90%, preferably, from 0.2 to 80% and, more preferably, from 0.2 to 60% of the total flow rate of the carbon source gas and the hydrogen. The mixing ratio varies depending on the kind of carbon source gas, etc. and an optimum combination may properly be determined.

If the flow rate of the carbon source gas in the gas mixture is less than 0.1%, the diamond thin film can not be formed or, even if it is formed, the growth rate is remarkably reduced.

The diamond thin film formed by the method according to the present invention includes a diamond thin film, a diamond-like carbon thin film or a thin film in which diamond and diamond-like carbon are mixed.

There is no particular restriction on the material for the substrate used in the method according to the present invention and optional material can be selected from metal such as silicon, aluminum, titanium, tungsten, molybdenum, cobalt and chromium, oxides, nitrides and carbides thereof, alloys thereof, super-hard alloys such as WC—Co series, WC—TiC—Co series and WC—TiC—TaC—Co series, cermet such as Al$_2$O$_3$—Fe, TiC—Ni, TiC—Co, TiC—TiN, B$_4$C—Fe, etc., as well as various kinds of glass ceramic and resin.

When electrical conductors or semiconductors such as, the metals, the alloys, the super-hard alloys are used as the substrate, this invention is more useful.

There is also no particular restriction on the shape of the substrate so long as it has a protruded portion at the surface of the substrate on which diamond thin film is to be formed. As the shape of the substrate, there can be mentioned optional shapes, for example, rod-like shape such as cylindrical rod shape, square rod shape, conical shape, pyramidical shape, tubular shape, drill-like shape; flat-plate like shape having convexed portion or trigonal or tetragonal plate-like shape.

In the case of the tetragonal or trigonal shape plate, the ridge lines form a protruded portion to which an auxiliary member (i.e., dispersing member) should be adjacent.

Where the substrate is a cutting tool or dentists' tool such as a drill, when it is coated with the diamond thin film obtained by the method according to the present invention, the substrate with the diamond thin film thus obtained can be used directly as the cutting tool or dentists' tool.

As such tools, there can be mentioned as a preferred embodiment, for example, perforating tools such as a solid drill and a micro drill; grinding chips of special shapes such as used for general lathing or cutting; an end mill, various cutting tools such as byte and dentists' tools such as a dentists' drill or a scaler chip.

In the method according to the present invention, a gas obtained by exciting a starting material gas containing a carbon source gas is brought into contact with the surface of the substrate on which a diamond thin film is formed under the presence of an auxiliary member placed near the protruded portion present at the surface of the substrate on which a diamond thin film is formed thereby forming diamond thin films at the surface of the substrate on which diamond thin film is formed.

There is no particular, restriction on the means of exciting the starting material gas so long as it can form diamond thin films by mean of a vapor phase method and any means can be employed, for example, a method of applying plasma decomposition by means of DC or AC arc discharge, a method of applying plasma decomposition by means of RF induction discharge, a method of applying plasma decomposition by means of microwave discharge (including ECR-CVD method and magnetic field-CVD method) an ion beam method of applying plasma decomposition in an ion chamber or by means of an ion gun thereby drawing out ions under an electric field or a thermal decomposition method for decomposing under heating by a heat filament (including EACVD method). Among the various excitation means, use of a microwave plasma CVD method or a high frequency wave plasma CVD method is particularly effective.

In the method according to the present invention, the reaction proceeds under the following conditions to deposit diamond thin films on the substrate.

Specifically, in the method according to the present invention, the temperature of the substrate is set, usually, at 300°–1300° C. and, preferably, at 500°–1100° C.

If the temperature is lower than 300° C., the growth rate of the diamond thin film is retarded or a film containing a great amount of amorphous carbon may be formed. On the other hand, if the temperature is higher than 1300° C., no corresponding effect can be obtained and it is rather disadvantageous in view of the energy efficiency.

In the method according to the present invention, the temperature of the substrate may be varied within the range mentioned above in the film-forming step but it is usually preferred to keep the temperature constant within the above-mentioned range. In particular, if the temperature distribution of the substrate is kept constant within the above-mentioned range, a diamond thin film having more excellent adhesion with the substrate and uniform film thickness can be obtained.

The reaction pressure is, usually, from $10^{-6}$–$10^3$ Torr and, preferably, $10^{-5}$ Torr to 760 Torr.

In the method according to the present invention, if the reaction pressure is set at lower than 1 Torr, it is preferred to excite the starting material gas in a state where a magnetic field is applied to the reaction chamber. It is preferable in this case to employ an ECR (electron-cyclotron-resonance)-CVD method for the excitation means of the starting material gas.

If the reaction pressure is lower than $10^{-6}$ Torr, the growth rate of the diamond thin film is retarded or the diamond thin film is not deposited. On the other hand, if the pressure is higher than $10^{-3}$ Torr, no corresponding effect can be obtained.

The reaction time can not generally be determined since it varies depending on the temperature of the substrate, reaction pressure and film thickness required. Accordingly, an optimum time may properly be selected.

In the method according to the present invention, it is important to place an auxiliary member adjacent to the protruded portion of the substrate upon bringing the plasma activated gas into contact with the substrate under the foregoing conditions and it includes various embodiments.

As the first embodiment, in a case where the substrate stands upright on the substrate-placing surface of a support member for supporting the substrate (for example, in a case of vertically-placing a cutting drill on the support member), the auxiliary member is placed adjacent to the substrate so as to oppose the top of the substrate as the protruded portion (i.e., tip of drill).

Referring more specifically, as shown in FIG. 1, for example, a rod-like substrate 1 having a top as a protruded portion 10 is supported on a support table 20 and an auxiliary member 2 is placed adjacent to the protruded portion 10 in a microwave plasma CVD apparatus.

"Adjacent to" means such a distance as capable of effectively dispersing plasmas near the protruded portion 10 of the substrate 1. To attain the state of "adjacent to", the distance between the protruded portion 10 of the substrate 1 and the end of the auxiliary member 2 is adjusted within a range, usually, of less than 5 mm, preferably, of less than 3 mm and, more preferably, of less than 1 mm. If the distance exceeds 5 mm, the auxiliary member 2 can no longer function sufficiently and may possibly fail to effectively prevent the plasmas from locally concentrating on the protruded portion 10 of the substrate 1.

Figure 2:
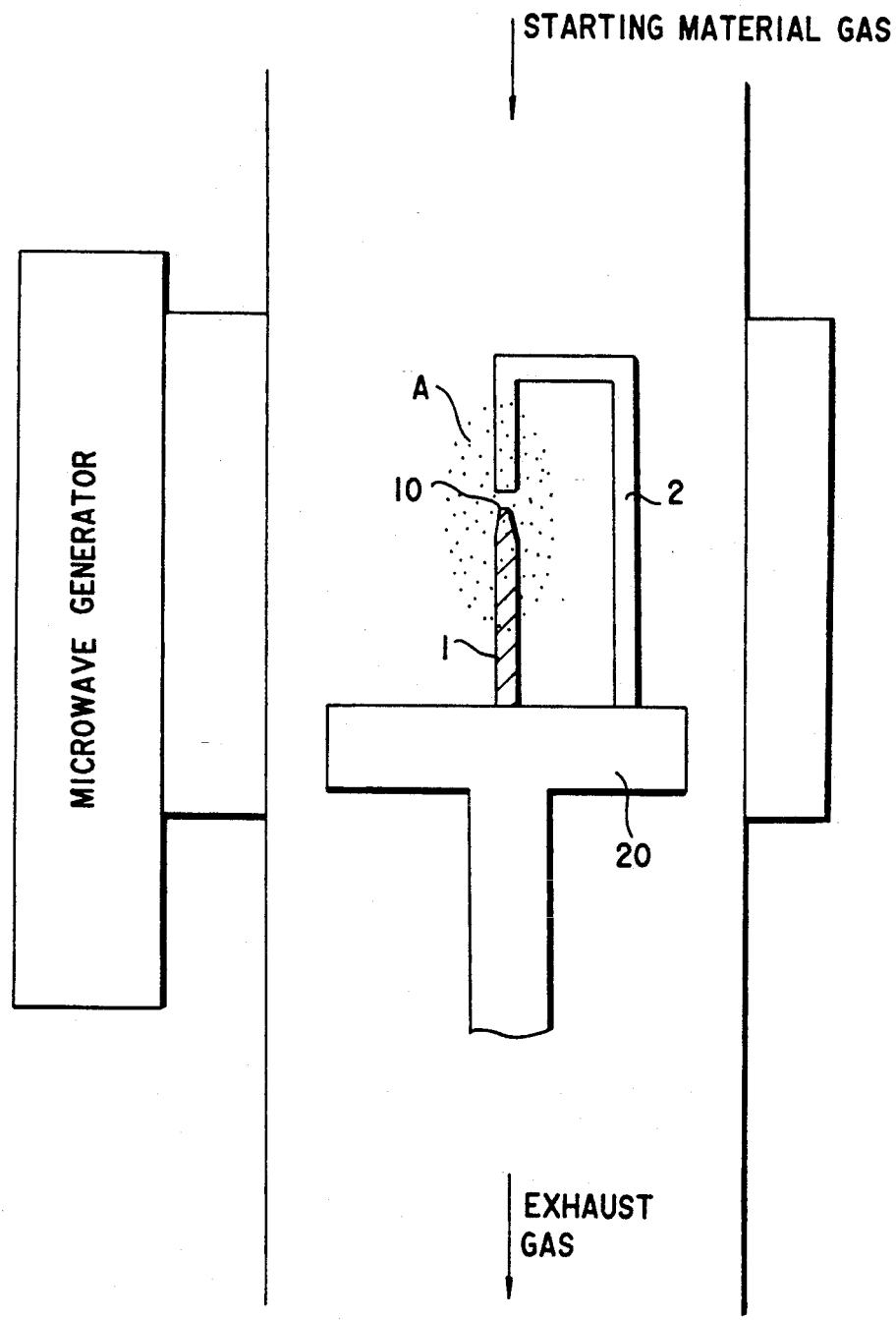
FIG. 2 is an explanatory view illustrating the dispersed state of the plasmas near the end of the substrate on which the thin film is to be formed.

The auxiliary member 2, placed as described above, has an function of dispersing plasmas A near the protruded portion 10 of the substrate 1 having a protruded portion 10, for example, as shown in FIG. 2, and preventing the local concentration of plasmas into the protruded portion 10.

There is no particular restriction for the material forming the auxiliary member 2 having a function or action and there can be used, preferably, for example, metal such as silicon, aluminum, titanium, tungsten, molybdenum, cobalt and chromium, oxides, nitrides and carbides thereof, alloys thereof and super-hard alloys such as WC-Co series, WC-TiC-Co series, WC-TiC-TaC-Co series, etc.

It is preferred to form the auxiliary member out of the material having identical or similar physical properties to those of the material for the substrate, for example, using super-hard alloys such as WC-Co series, WC-TiC-Co series or WC-TiC-Co series when the substrate comprise such super-hard alloys. If the material for the auxiliary member has identical or similar physical properties, particularly, thermal and electrical properties with those of the material for the substrate having the protruded portion, local concentration of plasmas can be prevented effectively in the present invention.

As the form of the material forming the auxiliary member, there can be selected a suitable shape similar to that of the substrate such as shapes such as linear, mesh-like, plate-like and rod-like shapes.

Specifically, if the substrate is a micro-drill, it is possible to suitably use a rod-like member such as a linear member as the auxiliary member, the linear member being particularly preferred for use. In FIG. 1, the auxiliary member stands upright at one end thereof from the support table 20 and is bent at the middle portion thereof so that the top end is opposed the top end of the substrate. However, the auxiliary member in the present invention is not always restricted to such a specific shape. In short, it is only necessary that the auxiliary member is disposed so as to be opposed to the protruded portion of the substrate.

In the method according to the present invention, it is possible to produce a diamond thin film having excellent adhesion and uniform thickness by disposing the auxiliary material as described above, thereby preventing the plasmas from locally concentrating on the end of the substrate and preventing melting at the end portion due to the abnormal local temperature increase and partial increase in the thickness of the diamond film.

As a second embodiment of placing the auxiliary member adjacent to the protruded portion of the substrate, there can be mentioned such an example in which an opening is formed to the support member such that the surface of the substrate on which the diamond thin film is to be formed is flush with the surface of the support member and such that there is a predetermined gap between the substrate and the inner wall of an opening of support member, and the substrate is placed within the opening.

This embodiment is suitable to a case where the substrate is a solid configuration having ridge lines and corner edges. In this case, the ridge lines constitutes the protruded portion and the inner surface of the support member in the opening opposed to the ridge lines functions as the auxiliary member.

Figure 3:
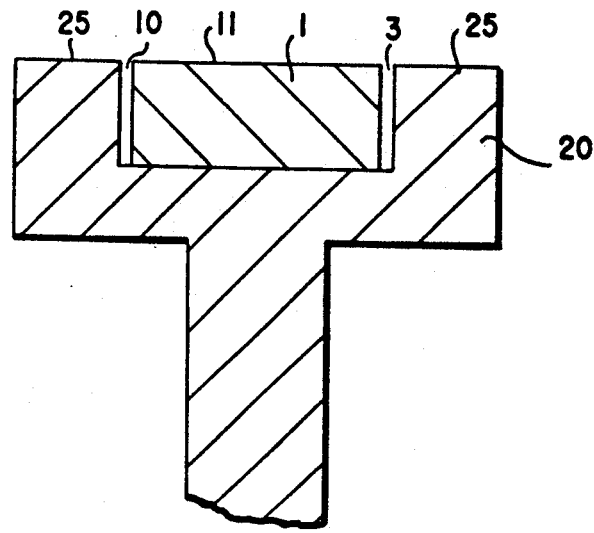
FIG. 3 is a cross sectional view illustrating one embodiment for the state of holding the substrate in the method according to the present invention.

Referring more specifically, in this embodiment, it is important that a substrate 1 (for example, as shown in FIG. 3) is held within an opening 3 of a support table 20 as the support member such that a surface 11 of the substrate 1 on which diamond thin film is to be formed is in flush with a surface 25 of the support table 20, in which diamond film to be formed to the surface 11 exposed in the opening 3 of the support table 20 and the circumferential side of the substrate 1.

In this text "in flush with" means that there is substantially no step between the surface 11 of the substrate 1 on which diamond thin film is to be formed and the upper surface 25 of the support table 20. However, there may be a more or less step within such a range as not hindering the purpose of the present invention. The step is usually within 1 mm while varying depending on the size and the material of the substrate, etc.

The gap between the inner circumferential surface of the opening in the support table and the ridge lines of the substrate is, usually, within 5 mm, preferably, within 3 mm and, more preferably, within 1 mm so that the diamond thin film can be formed on the circumferential side of the substrate.

The feature of the method according to the present invention resides in not forming apparent edges or corner to the substrate by designing the support member to a predetermined shape. Accordingly, if the step or the gap as described above exceeds the predetermined range described above, plasmas formed by the excitation of the starting material gas is locally concentrated to edges or corner of the substrate failing to obtain a diamond thin film and/or diamond-like carbon thin film of excellent uniform film thickness and peeling resistance.

There is no particular restriction also for the material forming the support member so long as it can withstand the reaction temperature upon forming the diamond thin film. For instance, it is preferred that the support material has identical or similar physical properties, particularly, thermal or electrical properties to those of the material for forming the substrates, for example, as using super-hard alloy such as WC-Co series, WC-TiC-Co series, WC-TiC-TaC-Co series when the substrate comprises super-hard alloys. With such material, temperature, particularly, temperature distribution for the support member and the substrate can be made uniform. Accordingly, when using microwaves or high frequency waves, it is preferred to select a combination of materials having similar or identical electric properties regarding the material of the substrate and the support member. If the material for forming the support member has identical or similar physical properties to those of the material forming the substrate, local concentration of plasmas can more effectively be prevented in the method according to the present invention.

In the method according to the present invention, it is possible to prevent local concentration of plasmas to the edge or corner of the substrate by holding the substrate as described above, thereby producing a diamond thin film and/or diamond-like carbon thin film of excellent uniform thickness and peeling resistance.

The following third embodiment can be mentioned as an example modified from the second embodiment.

Figure 4:
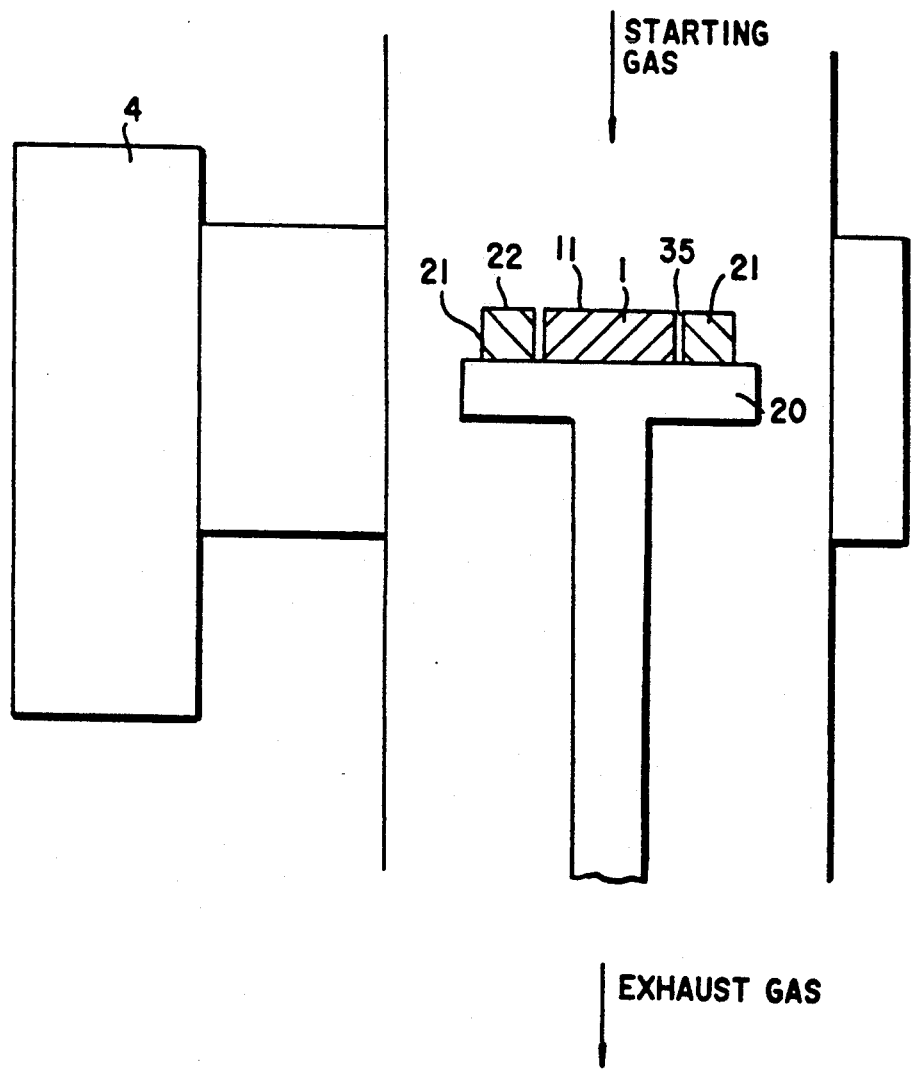
FIG. 4 is an explanatory view illustrating one embodiment for the producing apparatus according to the present invention.

As shown in FIG. 4, an auxiliary member 21 having a perforated aperture 35 is placed on a support table 20 as a support member and the substrate is held in the perforated aperture 35 in the third embodiment. In this embodiment, the auxiliary member 21 is a frame member which can be separated from the support table 20 and it is adapted such that the height of the auxiliary member 21 is substantially equal with that of the substrate 1, and the opening area of the perforated aperture 35 is adjusted such that the gap between the outer circumference of the substrate 1 and the inner surface of the perforated aperture 35, when the substrate 1 is held within the perforated aperture 35, is usually within 5 mm, preferably, within 3 mm, more preferably, within 1 mm. Since the height of the auxiliary member 21 and the height of the substrate 1 is substantially made identical, the upper surface of the substrate 1 is substantially in flush with the upper surface of the auxiliary member 21 and the result is similar to that of the second embodiment. The reason for controlling the opening area of the perforated aperture 35 such that the distance between the outer circumference of the substrate 1 and the inner surface of the perforated aperture 35, when the substrate 1 is held within the perforated aperture 35, is the same as that in the second embodiment.

Also in this third embodiment, the material for auxiliary member is identical with that of the support member as in the second embodiment.

In this third embodiment, if various kinds of shapes of auxiliary members are prepared in accordance with the shape of the substrate, that can cope with the formation of diamond thin films on the substrate of various shapes, by placing one of the auxiliary members on the support member, even with one identical producing apparatus, which is extremely convenient.

In the third embodiment, the auxiliary member 21 may also be fixed not-separatably to the support table 20.

In the second and the third embodiments, it is necessary that (1) the surface of the substrate on which diamond thin film is to be formed is substantially in flush with the upper surface of the auxiliary member and (2) the auxiliary member is so placed on the support member that there is a predetermined gap between the protruded portion of the substrate (in the case of a plate-like substrate, the ridge line constitute the protruded portion) and the auxiliary member. If the conditions (1) and (2) are satisfied, a diamond thin film of uniform film thickness can be formed easily even in a rod-like substrate, not only by the second and the third embodiments but also by the following fourth embodiment.

That is, in the fourth embodiment, a plurality of auxiliary members, for example, blocks or plates are disposed vertically on a support member so as to surround a rod-like substrate (a drill being included) that stands vertically on the support member, at the same height as that of the substrate with a gap to the substrate being the same as shown in the foregoing embodiment.

With such an embodiment, since the rod-like substrate is surrounded with a plurality of auxiliary members, the top of the substrate is regarded as not being protruded in the space where the plasma gas is present and, accordingly, concentration of plasmas to the top of the substrate can be prevented.

Next, a description is specifically made for the producing apparatus capable of practicing the second and the third embodiments referring to the second embodiment as an example.

The producing apparatus capable of practicing the second embodiment has a support member having an opening for holding the substrate, the opening formed flush with the surface of the substrate on which the diamond thin film is to be formed, and an electric discharge device.

Figure 5:
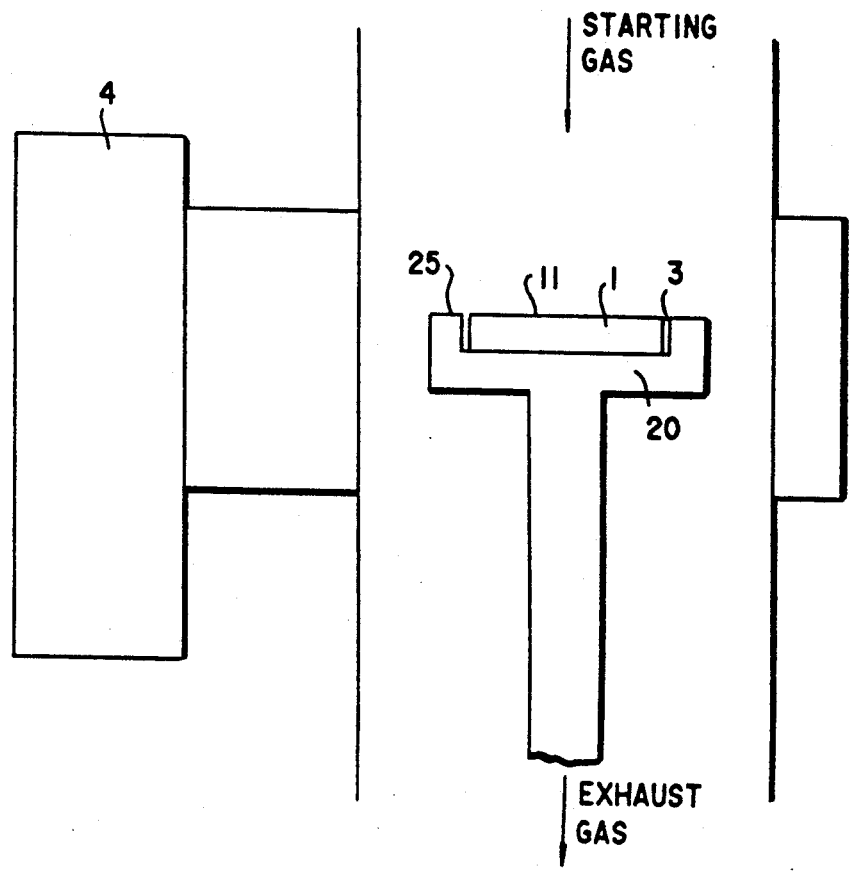
FIG. 5 is an explanatory view illustrating another embodiment for the producing apparatus according to the present invention.

FIG. 5 shows a microwave plasma CVD device as an example of the producing apparatus according to the present invention.

As shown in FIG. 5, the producing apparatus according to the present invention comprises a support table 20 having an opening 3 for holding the substrate 1 and a microwave oscillator 4.

The opening 3 which is made on a certain part of surface 25 of the support table 20, is formed to have such a size that it can contain the substrate 1 and has a gap of predetermined size between the substrate contained and the inner surface of the opening 3 as specified above. The depth of the opening 3 is adjusted so that the surface 11 of the substrate 1, on which the diamond thin film is to be formed, placed in the opening 3 is flush with the opening-formed surface 5.

Instead of the support table 20 shown in FIG. 5, the support table 20 and the auxiliary member 21 as shown in FIG. 4 may be used.

There is no particular restriction on the shape of the opening 3 so long as the surface 11 of the substrate 1 on which the diamond thin film is to be formed can be flush with the opening formed surface 25 of the support table 20 and it may be a rectangular or trigonal shape or a shape like that of the blade chip of the grinding drill, etc.

With such a constitution as described above, it is possible to excite the starting material gas while preventing the local concentration of the plasmas thereby attaining to form a diamond thin film of excellent uniform thickness and peeling resistance and growth at high speed rate.

Accordingly, the producing apparatus according to the present invention can effectively practice the method according to the present invention and a diamond thin film produced by using the producing apparatus according to the present invention is excellent in uniform film thickness and peeling resistance.

In the method according to the present invention, even if a substrate has a fine end such as of a micro drill, it is possible to efficiently produce a high quality diamond thin film of excellent adhesion and uniform film thickness at good reproducibility and stability, under easy control of the film-forming conditions, under preventing local concentration of plasmas at the end portion, without abnormal heat generation or abnormal film formation.

The thus obtained diamond film can be used suitably, for example, not only for tools such as cutting tool, grinding tools or dentists' tools but also for hard coating material for various parts such as abrasion resistant machinery parts of specified shapes having a protruded portion or electronic materials it is possible to provide a method of producing a diamond thin film which is industrially useful and having the following merits.

Advantageous effects of the present invention will be summarized below.

According to the present invention, (1) Since a gas obtained by exciting a starting material gas containing a carbon source gas is brought into contact with a substrate having a protruded portion (minute end) in the presence of an auxiliary member (or dispersing member) placed adjacent to the protruded portion of the substrate, even if the substrate is such a substrate as having a minute end, e.g., a microdrill or a cutting chip in a square shape having corners, plasmas near the end portion or the corners, which are most important in tools, can be dispersed and prevented effectively from locally concentrating at the end portion.

(2) Therefore, since it is possible to uniformly heat the substrate under uniform plasmas, melting due to excess heat at the protruded portion or the increase of the film thickness due to the abnormal film formation can be prevented thereby forming a diamond thin film and/or diamond-like carbon thin film of excellent adhesion with the substrate and uniform film thickness can be obtained.

(3) Since the reproducibility and the stability are excellent and the film forming conditions can be controlled with ease, it is possible to form a coating substrate of a high quality diamond thin film even on a non-flat plate substrate having a particular shape.

Furthermore, according to the producing apparatus of the present invention, the method according to the present invention can be practiced easily with a simple structure and, as a result, it is possible to form a diamond thin film of uniform thickness with good adhesion even to a substrate in which the protruded portion is present.

The present invention will be described more specifically referring to examples and comparative examples.

EXAMPLE 1

A micro drill used for perforating printed substrate having WC-6% Co composition (JIS K10 $\phi=2.0$) was placed as a substrate, in a reaction chamber of a microwave plasma CVD apparatus, and an auxiliary member made of a tungsten wire of 1.0 mm diameter was placed at 2 mm gap to the end of the drill as shown in FIG. 1.

Then, a gas mixture comprising 5% carbon monoxide and 95% hydrogen gas was introduced into the reaction chamber at a flow rate of 100 sccm and the power of a microwave power source at a frequency of 2.45 GHz was set to 70 W under the conditions of a pressure of 40 Torr and a substrate temperature of 900° C. in the reaction chamber.

A micro drill having a thin film used for perforating printed substrate was produced by applying a plasma treatment using the microwave discharge system for 6 hours under the above-mentioned conditions. The substrate, the part of the micro drill used for perforating a printed substrate, was used after cleaning.

After completion of the reaction, when the micro drill having the thin film used for perforating a printed substrate was taken out from the reaction chamber and subjected to Raman spectroscopic analysis of the thin film, a sharp peak belonging to a diamond was observed at 1333 cm$^{-1}$.

The film thickness in each of the positions of the thin film was 4-4.5 $\mu$m and showed excellent uniform thickness.

EXAMPLE 2

The same procedures as those in Example 1 were applied except for changing the flow rate of the gas mixture from 100 sccm to 50 sccm and changing the temperature of the micro drill from 900° C. to 950° C. in Example 1.

After completion of the reaction, when the micro drill having the thin film used for perforating the printed substrate was taken out from the reaction chamber and subjected to Raman spectroscopic analysis of the thin film, a sharp peak belonging to a diamond was observed at 1333 $cm^{-1}$.

The film thickness in each of the positions of the thin film was 7-8 $\mu m$ and showed excellent uniform thickness.

COMPARATIVE EXAMPLE 1

A micro drill having a thin film used for perforating a printed substrate was produced in the same procedures as those in Example 1 except for not placing the auxiliary member to the end of the substrate of the printed substrate perforating drill.

The thus obtained printed substrate perforating micro drill having the thin film was taken out from the reaction chamber and, when it was subjected to Raman spectroscopic analysis of the thin film, a sharp peak belonging to a diamond was recognized at 1333 $cm^{-1}$.

The film thickness in each of the portions of the thin film was 0-7 $\mu m$. The thin film was not formed on some parts of the substrate. The film was not uniform and readily peelable as compared with the thin film of the printed substrate perforating micro drill having the diamond thin film obtained in Example 1 or 2.

EVALUATION

From the results of Examples 1 and 2 and Comparative Example 1, it has been confirmed that a diamond thin film of excellent adhesion with the substrate and excellent uniform film thickness can be obtained by the method according to the present invention.

EXAMPLE 3

Using a microwave plasma CVD production apparatus of the constitution as shown in FIG. 4, a cutting chip (12.7×12.7×3.18 mmH) having WC-6% Co composition was contained, as a substrate, in an opening (13.7×13.7×3.18 mmH) of a holder member having WC-6% Co composition.

Then, a gas mixture comprising 93% hydrogen gas and 7% carbon monoxide gas was introduced at a total flow rate of hydrogen gas and carbon monoxide gas of 100 sccm into the reaction chamber and the power of the microwave power source at a frequency of 2.45 GHz was set to 400 W under the conditions of a pressure of 40 Torr and a temperature of the substrate at 900° C. in the reaction chamber. Under the conditions, plasma treatment with microwave discharge was applied for 5 hours to producing a cutting chip on which thin film was formed.

The cutting chip was used after cleaning with a 1/10 cleaning agent ("Rangel E", manufactured by Nikka Seiko Co.) (liquid temperature at 50° C.) and with purified water successively at a rate of once in 60 sec each for three times.

After the reaction was over, when the thin film for the cutting chip was subjected to Raman spectroscopic analysis, a sharp peak belonging to a diamond was observed at 1333 $cm^{-1}$.

The film thickness in each portion of the thin film was 5-5.5 $\mu m$ and it was of excellent uniform thickness.

The rate of the occurrence of samples showing peeling was determined for cutting chips with diamond thin film obtained by the same procedures as described above.

This result is shown in Table 1.

COMPARATIVE EXAMPLE 2

A cutting chip having thin film was produced with the same procedures as those in Example 3 except for not using the holder member but placing a cutting chip having WC-6% Co composition on a flat substrate made of boron nitride.

After the reaction was over, when the thin films of the cutting chip were subjected to Raman spectroscopic analysis, a sharp peak belonging to a diamond was observed at of 1333 $cm^{-1}$.

The film thickness in each of the portions of the thin films was 4 $\mu m$ (central portion) to 13 $\mu m$ (edge portion) and the uniform thickness of the diamond thin film was poor as compared with the cutting chip with diamond thin film obtained in Example 3.

The rate of occurrence of samples showing peeling was determined for the cutting chips with the diamond thin film obtained by the same procedures as above.

The result is shown in Table 1.

TABLE 1

|  | Example 3 | Comparative Example 2 |
| --- | --- | --- |
| Occurrence of samples showing peeling (%) | 5 | 37 |

EVALUATION

From the results of Example 3 and Comparative Example 2, it has been confirmed that there was no local concentration of plasmas in the method according to the present invention using the producing apparatus according to the present invention. Further, it is possible to obtain a diamond thin film of excellent uniform thickness and, as apparent from Table 1, with excellent peeling resistance by the method according to the present invention using the producing apparatus according to the present invention.

What is claimed is:

1. A method of producing one of a diamond film and a diamond-like carbon film on a substrate comprising the steps of:
   forming a top surface of said substrate with a protruding portion;
   placing a bottom surface of said substrate on a support member in a reaction chamber;
   opposing an end of an auxiliary member adjacent to said protruding portion, said end having a shape similar to said protruding portion;
   separating the protruding portion and the end of the auxiliary member by a gap less than 5 mm, wherein said diamond film or diamond-like carbon film to be formed on said top surface of said substrate;
   exciting a starting material gas containing a carbon source gas to obtain a plasma gas;
   dispersing the plasma gas uniformly near said protruding portion and preventing local concentration of said plasma gas onto the protruding portion by said end of said auxiliary member; and
   coating the top surface of the substrate with the plasma gas in a presence of the auxiliary member.

2. A method of producing one of a diamond film and a diamond-like carbon film as defined in claim 1, wherein the auxiliary member is made of a same material as that for the substrate.

3. A method of producing one of a diamond film and a diamond-like carbon film as defined in claim 2, wherein both of the auxiliary member and the substrate are made of material selected from WC-Co super-hard alloy, WC-TiC-Co super-hard alloy and WC-TiC-TaC-Co super-hard alloy.

4. A method of producing one of a diamond film and a diamond-like carbon film as defined in claim 3, wherein both of the auxiliary member and the substrate are made of WC-Co super-hard alloy.

5. A method of producing one of a diamond film and a diamond-like carbon film as defined in claim 1, wherein the starting material gas is excited by means of a microwave plasma method.

6. A method of producing one of a diamond film and a diamond-like carbon film as defined in claim 1, wherein the starting material gas containing the carbon source gas comprises carbon monoxide and hydrogen gas.

* * * * *